United States Patent
Epperson et al.

(10) Patent No.: US 10,359,494 B2
(45) Date of Patent: *Jul. 23, 2019

(54) PROVING UNIT FOR NON-CONTACT VOLTAGE MEASUREMENT SYSTEMS

(71) Applicant: Fluke Corporation, Everett, WA (US)

(72) Inventors: David L. Epperson, Everett, WA (US); Ricardo Rodriguez, Mill Creek, WA (US)

(73) Assignee: FLUKE CORPORATION, Everett, WA (US)

( * ) Notice: Subject to any disclaimer, the term of this patent is extended or adjusted under 35 U.S.C. 154(b) by 235 days.

This patent is subject to a terminal disclaimer.

(21) Appl. No.: 15/439,473

(22) Filed: Feb. 22, 2017

(65) Prior Publication Data

US 2018/0136302 A1    May 17, 2018

Related U.S. Application Data

(60) Provisional application No. 62/421,124, filed on Nov. 11, 2016.

(51) Int. Cl.
*G01R 35/00* (2006.01)
*G01R 19/18* (2006.01)
(Continued)

(52) U.S. Cl.
CPC ............... *G01R 35/00* (2013.01); *G01R 1/22* (2013.01); *G01R 15/14* (2013.01); *G01R 19/00* (2013.01); *G01R 19/18* (2013.01); *H02M 7/44* (2013.01)

(58) Field of Classification Search
CPC ............... G01R 19/00; G01R 19/0084; G01R 19/0092; G01R 19/18; G01R 27/00;
(Continued)

(56) References Cited

U.S. PATENT DOCUMENTS 4,580,188 A * 4/1986 Brown ............... H05F 3/02
324/133
5,473,244 A  12/1995 Libove et al.
(Continued)

FOREIGN PATENT DOCUMENTS

CN   2639905 Y   9/2004
EP   1 249 706 B1   9/2017
(Continued)

OTHER PUBLICATIONS

HIOKI, "3258 : Safety HiTESTER," Revised Edition 5, HIOKI E. E. Corporation, Nagano Japan, 2 pages.
(Continued)

*Primary Examiner* — Hoai-An D. Nguyen
(74) *Attorney, Agent, or Firm* — Seed IP Law Group LLP

(57) ABSTRACT

Systems and methods provide a portable, verified voltage source that allows safe testing of separate non-contact voltage measurement systems. A proving unit of the present disclosure provides a known or specified alternating current (AC) voltage output across an insulated wire, which AC voltage may be fixed or may be user-selectable through a suitable user interface. The proving unit may include a visual indicator and/or an audible indicator that provides the user with an indication confirming that the proving unit is supplying an output voltage with the specifications of the proving unit, so the user will know that the proving unit is operating normally and is ready for testing a non-contact voltage measurement system. If the proving unit cannot provide the specified voltage output, the indicator(s) provides a signal to the user that the proving unit is currently non-functional.

20 Claims, 4 Drawing Sheets

(51) Int. Cl.
  *G01R 15/14* (2006.01)
  *H02M 7/44* (2006.01)
  *G01R 1/22* (2006.01)
  *G01R 19/00* (2006.01)

(58) Field of Classification Search
  CPC ........ G01R 27/08; G01R 31/00; G01R 31/08;
          G01R 35/00; G01R 1/00; G01R 1/22;
          G01R 15/00; G01R 15/12; G01R 15/14;
          G01R 15/144; G01R 15/146
  USPC ...... 324/600, 612, 522, 713, 76.11, 120, 74;
              702/1, 57, 64, 108, 124, 126
  See application file for complete search history.

(56) References Cited

U.S. PATENT DOCUMENTS

| | | | |
|---|---|---|---|
| 5,583,444 | A | 12/1996 | Nakamura et al. |
| 5,973,501 | A | 10/1999 | Reichard |
| 6,014,027 | A | 1/2000 | Reichard |
| 6,118,270 | A | 9/2000 | Singer et al. |
| 6,351,399 | B2 * | 2/2002 | Takanashi ............ H02M 1/08 363/56.05 |
| 6,664,708 | B2 | 12/2003 | Shlimak et al. |
| 6,812,685 | B2 | 11/2004 | Steber et al. |
| 6,825,649 | B2 | 11/2004 | Nakano |
| 7,084,643 | B2 | 8/2006 | Howard et al. |
| 7,466,145 | B2 | 12/2008 | Yanagisawa |
| 8,054,061 | B2 | 11/2011 | Prance et al. |
| 8,222,886 | B2 | 7/2012 | Yanagisawa |
| 8,410,883 | B2 * | 4/2013 | Asplund ............ H01F 37/005 336/84 C |
| 8,680,845 | B2 | 3/2014 | Carpenter et al. |
| 8,803,506 | B2 | 8/2014 | Yanagisawa |
| 9,063,184 | B2 | 6/2015 | Carpenter et al. |
| 9,201,100 | B2 | 12/2015 | Yanagisawa |
| 10,119,998 | B2 * | 11/2018 | Ringsrud et al. ...... G01R 15/16 324/126 |
| 2002/0167303 | A1 | 11/2002 | Nakano |
| 2004/0073146 | A1 * | 4/2004 | Weintraub ............. A61H 11/02 601/134 |
| 2004/0143994 | A1 * | 7/2004 | Baron ..................... D06F 35/00 34/597 |
| 2006/0133798 | A1 * | 6/2006 | Palmer .................. G02B 23/12 396/427 |
| 2010/0090682 | A1 | 4/2010 | Armstrong |
| 2010/0283539 | A1 | 11/2010 | Yanagisawa |
| 2011/0276300 | A1 | 11/2011 | Gallavan |
| 2016/0109486 | A1 | 4/2016 | Yanagisawa |
| 2016/0204646 | A1 * | 7/2016 | Park ........................ H02J 7/025 320/108 |
| 2018/0136303 | A1 * | 5/2018 | Epperson et al. ..... G01R 35/00 324/612 |

FOREIGN PATENT DOCUMENTS

| | | |
|---|---|---|
| JP | 2006-242855 A | 9/2006 |
| JP | 2007-163414 A | 6/2007 |
| JP | 2007-163415 A | 6/2007 |
| JP | 2007-212204 A | 8/2007 |
| JP | 2007-256141 A | 10/2007 |
| JP | 2008-2925 A | 1/2008 |
| JP | 2008-14644 A | 1/2008 |
| JP | 2008-14645 A | 1/2008 |
| JP | 2008-20270 A | 1/2008 |
| JP | 2008-261646 A | 10/2008 |
| JP | 2008-261783 A | 10/2008 |
| JP | 2008-261785 A | 10/2008 |
| JP | 2009-168696 A | 7/2009 |
| JP | 2010-25778 A | 2/2010 |
| JP | 2010-286347 A | 12/2010 |
| JP | 2011-122860 A | 6/2011 |
| JP | 2012-47677 A | 3/2012 |
| JP | 2014-44168 A | 3/2014 |
| JP | 2014-44169 A | 3/2014 |
| JP | 2015-111087 A | 6/2015 |
| JP | 2016-3997 A | 1/2016 |

OTHER PUBLICATIONS

Mitchell Instrument Company Inc., clipping from the Mitchell Catalogue, undated, 1 page.
Takahashi, "Clamp on Power Logger PW3365 : Safety Voltage Sensor PW9020," *HIOKI Technical Notes* 1(1): 2015, 8 pages.
Calmet Ltd., "Multifunction Calibrator of alternating and direct voltage current," downloaded on Feb. 7, 2018 from http://www.calmet.com.pl/images/pdf/C101F%20data%20sheet.pdf, 2012, 2 pages.
Fluke Corporation, "The 5700A/5720A Series II High Performance Multifunction Calibrators Extended Specifications," downloaded on Feb. 7, 2018 from http://download.flukecal.com/pub/literature/1268275Gw.pdf, 2012, 27 pages.
Fluke Corporation, "Clamp Meter Service Information," downloaded on Feb. 7, 2018 from http://www.industrialcalibration.co.uk/downloads/Fluke%2030%20Clamp%20Meter%20Service%20Date.pdf, 1998, 4 pages.
Galliana et al., "Traceable Technique to Calibrate Clamp Meters in AC Current From 100 to 1500A," *IEEE Transactions on Instrumentation and Measurement* 61(9):2512-2518, 2012.
Tsang et al., "Dual capacitive sensors for non-contact AC voltage measurement," *Sensors and Actuators A* 167:261-266, 2011.

* cited by examiner

PROVING UNIT FOR NON-CONTACT VOLTAGE MEASUREMENT SYSTEMS

BACKGROUND

Technical Field

The present disclosure generally relates to measurement of electrical characteristics, and more particularly, to proving units for non-contact measurement of alternating current (AC) voltage.

Description of the Related Art

Voltmeters are instruments used for measuring voltage in an electric circuit. Instruments which measure more than one electrical characteristic are referred to as multimeters or digital multimeters (DMMs), and operate to measure a number of parameters generally needed for service, troubleshooting, and maintenance applications. Such parameters typically include alternating current (AC) voltage and current, direct current (DC) voltage and current, and resistance or continuity. Other parameters, such as power characteristics, frequency, capacitance, and temperature, may also be measured to meet the requirements of the particular application.

With conventional voltmeters or multimeters which measure AC voltage, it is necessary to bring at least one measurement electrode or probe into galvanic contact with a conductor, which often requires cutting away part of the insulation of an insulated electrical wire, or providing a terminal for measurement in advance. Besides requiring an exposed wire or terminal for galvanic contact, the step of touching voltmeter probes to stripped wires or terminals can be relatively dangerous due to the risks of shock or electrocution.

A non-contact voltage detector may be used to detect the presence of alternating current (AC) voltage, typically high voltage, without requiring galvanic contact with the circuit. When a voltage is detected, the user is alerted by an indication, such as a light, buzzer, or vibrating motor. Such non-contact voltage detectors provide only an indication of the presence or absence of an AC voltage, and do not provide an indication of the actual magnitude (e.g., RMS value) of the AC voltage.

BRIEF SUMMARY

A proving unit to verify the operation of a non-contact alternating current (AC) voltage measurement system may be summarized as including a direct current (DC) power source subsystem, the DC power source subsystem comprising an output that provides a DC voltage; a DC-to-AC converter comprising an input and an output, the input of the DC-to-AC converter electrically coupled to the output of the DC power source subsystem, wherein in operation the DC-to-AC converter receives the DC voltage from the DC power source subsystem and converts the DC voltage to a specified AC voltage at the output of the DC-to-AC converter; an insulated wire comprising a conductor surrounded by an insulation layer, the conductor electrically coupled to the output of the DC-to-AC converter; and a wire support portion coupled to the insulated wire which physically supports the insulated wire such that the insulated wire is accessible to a separate non-contact AC voltage measurement system capable of measuring voltage in the insulated wire without galvanically contacting the conductor in the insulated wire.

The proving unit may further include a housing containing the DC power source subsystem and the DC-to-AC converter, wherein the wire support portion supports the insulated wire such that at least a portion of a length of the insulated wire is spaced outward apart from an external surface of the housing. The wire support portion may include a first wire support member extending outward from the housing and a second wire support member extending outward from the housing, the second wire support member spaced apart from the first wire support member, the first wire support member supporting a first end of the insulated wire and the second wire support member supporting a second end of the insulated wire opposite the first end such that insulated wire spans between the first wire support member and the second wire support member. The DC power source subsystem may include at least one battery. The housing may include at comprises a battery compartment sized and dimensioned to receive at least one battery therein, and the DC power source subsystem may include an input that is electrically coupleable to the at least one battery positioned in the battery compartment. The DC-to-AC converter may include at least one of a switching boost converter or a transformer.

The proving unit may further include an indicator that in operation provides an indication of whether a specified AC voltage is present in the insulated wire, the indicator comprising at least one of an audible indicator or a visual indicator.

The proving unit may further include a user interface; and at least one processor communicatively coupled to the user interface and the DC-to-AC converter, wherein, in operation, the at least one processor: receives, via the user interface, a selection of an AC voltage level from a plurality of AC voltage levels; and causes the DC-to-AC converter to output the AC voltage at the selected AC voltage level based at least in part on the received selection.

The proving unit may include a strap mount coupled to an external surface of a housing containing the DC power source subsystem and the DC-to-AC converter, the strap mount operative to selectively couple with a strap.

The proving unit may include an AC power source subsystem, wherein in operation the AC power source subsystem receives AC power from an AC power source, and directly or indirectly provides power to the DC-to-AC converter. The AC power source subsystem may provide power to at least one battery electrically coupled to the DC power source subsystem.

A method to verify the operation of a non-contact alternating current (AC) voltage measurement system may be summarized as including providing, via an output of a direct current (DC) power source subsystem, DC power received from a DC power source; receiving, at an input of a DC-to-AC converter, the DC power output from the DC power source subsystem; converting, via the DC-to-AC converter, the received DC voltage to a specified AC voltage at an output of the DC-to-AC converter; and energizing an insulated wire with the specified AC voltage output by the DC-to-AC converter, wherein the insulated wire comprises a conductor surrounded by an insulation layer and is accessible to a separate non-contact AC voltage measurement system capable of measuring voltage in the insulated wire without galvanically contacting the conductor in the insulated wire. The method may include supporting the insulated wire such that at least a length of the insulated wire is spaced apart from any an external surface of a housing containing the DC power source subsystem and the DC-to-AC converter. Supporting the insulated wire may include supporting the insulated wire via a first wire support member and a second wire support member, the second wire support member spaced apart from the first wire support member, the first wire support member supporting a first end of the insulated wire and the second wire support member supporting a second end of the insulated wire opposite the first end such that insulated wire spans between the first wire support member and the second wire support member. Providing DC power may include providing DC power received from at least one battery.

The method may further include providing, via an indicator, an indication of whether a specified AC voltage is present in the insulated wire.

The method may further include receiving, via a user interface, a selection of an AC voltage level from a plurality of AC voltage levels; and causing the DC-to-AC converter to output the AC voltage at the selected AC voltage level based at least in part on the received selection.

The method may further include receiving, via an AC power source subsystem, AC power from an AC power source; and providing, directly or indirectly, power to the DC-to-AC converter via the AC power source subsystem. Providing power to the DC-to-AC converter may include providing power to at least one battery electrically coupled to the DC power source subsystem.

A proving unit to verify the operation of a non-contact alternating current (AC) voltage measurement system may be summarized as including a housing; a direct current (DC) power source subsystem disposed within the housing, the DC power source subsystem comprising an input that receives power from at least one battery and an output that provides a DC voltage; a DC-to-AC converter disposed in the housing, the DC-to-AC converter comprising an input and an output, the input of the DC-to-AC converter electrically coupled to the output of the DC power source subsystem, wherein in operation the DC-to-AC converter receives the DC voltage from the DC power source subsystem and converts the DC voltage to a specified AC voltage at the output of the DC-to-AC converter; an insulated wire comprising a conductor surrounded by an insulation layer, the conductor electrically coupled to the output of the DC-to-AC converter; and a wire support portion coupled to the insulated wire which physically supports the insulated wire such that at least a portion of a length of the insulated wire is spaced outward apart from an external surface of the housing.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements may be arbitrarily enlarged and positioned to improve drawing legibility. Further, the particular shapes of the elements as drawn, are not necessarily intended to convey any information regarding the actual shape of the particular elements, and may have been solely selected for ease of recognition in the drawings.

DETAILED DESCRIPTION

Figure 1:
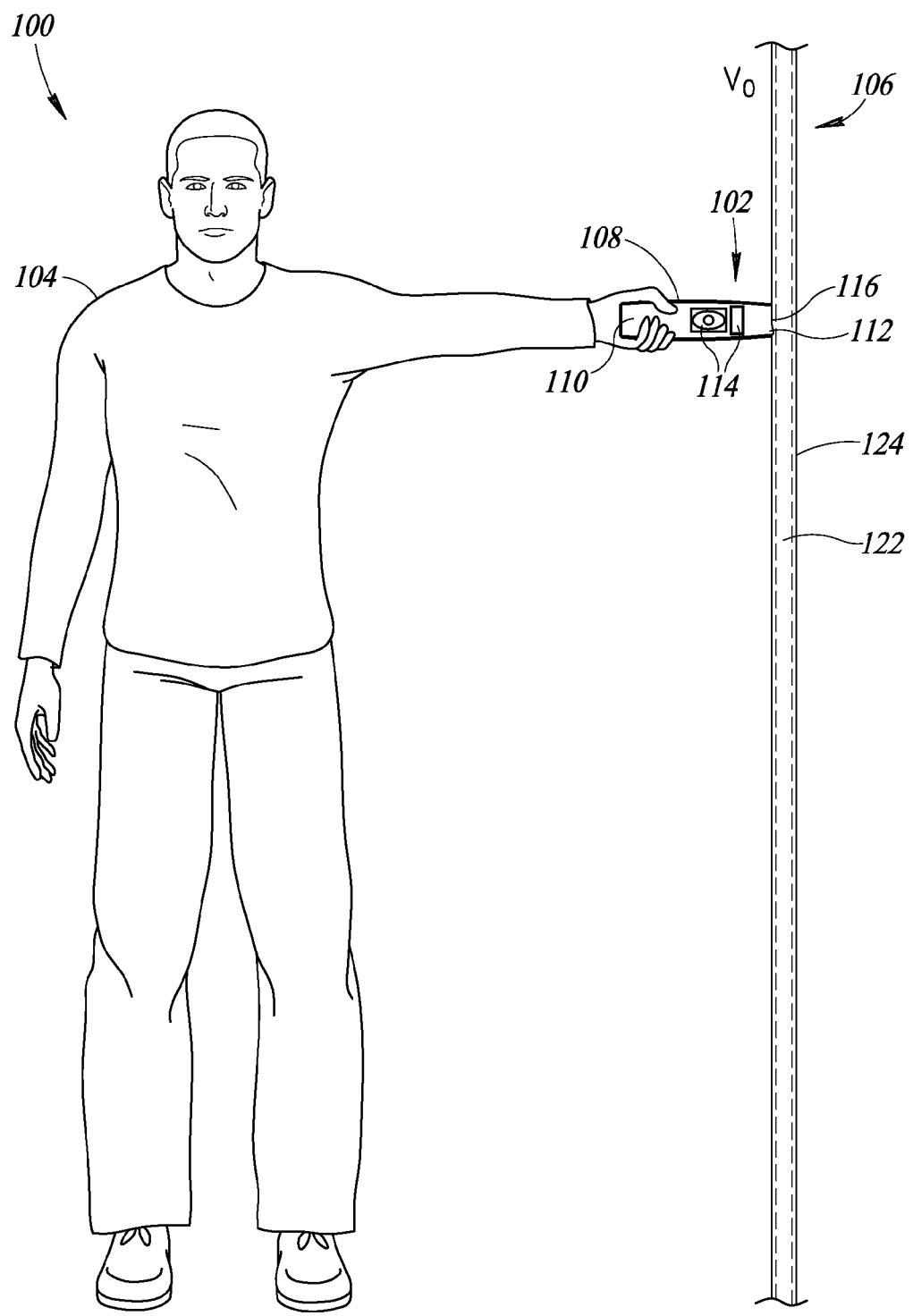
FIG. 1 is a pictorial diagram of an environment in which a non-contact voltage measurement system may be used by an operator to measure AC voltage present in an insulated wire without requiring galvanic contact with the wire, according to one illustrated implementation.

Recently, AC voltage measurement systems that provide convenient and accurate voltage measurements without requiring galvanic contact with the circuit being tested have been developed. In some applications, technicians using such non-contact voltage measurement systems may be in areas where no known sources of voltage can be found to verify the operation of the non-contact voltage measurement systems. For example, a technician may be in a tower of a wind generator or at a remote pumping site where power has to be shut off or has gone off-line due to weather or other causes. In some applications, there may be a need or requirement to verify the operation of a non-contact voltage measurement system on a known voltage source before, and possibly after, a test of a circuit is performed. Implementations of the present disclosure advantageously provide portable non-contact voltage measurement system proving units, or "proving units," which may be used by technicians in situations where there are no known voltage sources or all known voltage sources are de-energized. In the following description, certain specific details are set forth in order to provide a thorough understanding of various disclosed implementations. However, one skilled in the relevant art will recognize that implementations may be practiced without one or more of these specific details, or with other methods, components, materials, etc. In other instances, well-known structures associated with computer systems, server computers, and/or communications networks have not been shown or described in detail to avoid unnecessarily obscuring descriptions of the implementations.

Unless the context requires otherwise, throughout the specification and claims that follow, the word "comprising" is synonymous with "including," and is inclusive or open-ended (i.e., does not exclude additional, unrecited elements or method acts).

Reference throughout this specification to "one implementation" or "an implementation" means that a particular feature, structure or characteristic described in connection with the implementation is included in at least one implementation. Thus, the appearances of the phrases "in one implementation" or "in an implementation" in various places throughout this specification are not necessarily all referring to the same implementation. Furthermore, the particular features, structures, or characteristics may be combined in any suitable manner in one or more implementations.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

The headings and Abstract of the Disclosure provided herein are for convenience only and do not interpret the scope or meaning of the implementations.

As discussed further below, at least some of the implementations of proving units discussed herein provide a portable, verified voltage source that allows safe testing of non-contact voltage measurement systems. A proving unit of the present disclosure may provide a verified voltage output (e.g., 100 VAC, 120 VAC, 240 VAC, 250 VAC), which may be fixed or may be user-selectable through a suitable user interface (e.g., switch, dial, touchscreen). The proving unit may include a visual indicator (e.g., LED, display) and/or an audible or haptic indicator (e.g., speaker, buzzer) that provides the user with an indication that the proving unit is in fact supplying an output voltage with the specifications of the proving unit, so the user will know that the proving unit is operating normally and is ready for testing non-contact voltage measurement systems. In this example, if the proving unit cannot provide the specified voltage output for whatever reason (e.g., low battery), the indicator(s) provides a signal to the user that the proving unit is currently non-functional.

FIG. 1 is a pictorial diagram of an environment 100 in which a non-contact voltage measurement system 102 may be used by a technician 104 to measure AC voltage present in an insulated wire 106 without requiring galvanic contact between the non-contact voltage measurement system and the wire 106. FIGS. 2-6 show various views of a non-contact voltage measurement system proving unit or system 200 that may be used to verify the operation of the non-contact voltage measurement system 102 or other non-contact voltage measurement systems.

The non-contact voltage measurement system 102 includes a housing or body 108 which includes a grip portion or end 110 and a probe portion or end 112, also referred to herein as a front end, opposite the grip portion. The housing 108 may also include a user interface 114 which facilitates user interaction with the non-contact voltage measurement system 102. The user interface 114 may include any number of inputs (e.g., buttons, dials, switches, touch sensor) and any number of outputs (e.g., display, LEDs, speakers, buzzers). The non-contact voltage measurement system 102 may also include one or more wired and/or wireless communications interfaces (e.g., USB, Wi-Fi®, Bluetooth®).

In at least some implementations, the probe portion 112 may include a recessed portion 116 that receives the insulated wire 106. The insulated wire 106 includes a conductor 122 and an insulator 124 surrounding the conductor 122. The recessed portion 116 may include a sensor or electrode which rests proximate the insulator 124 of the insulated wire 106 when the insulated wire is positioned within the recessed portion 116 of the non-contact voltage measurement system 102. Although not shown for clarity, the sensor may be disposed inside of the housing 108 to prevent physical and electrical contact between the sensor and other objects.

As shown in FIG. 1, in use the operator 104 may grasp the grip portion 110 of the housing 108 and place the probe portion 112 proximate the insulated wire 106 so that the non-contact voltage measurement system 102 may accurately measure the AC voltage present in the wire with respect to earth ground (or another reference node). Although the probe end 112 is shown as having the recessed portion 116, in other implementations the probe portion 112 may be configured differently. For example, in at least some implementations, the probe portion 112 may include a selectively movable clamp, a hook, a flat or arcuate surface which includes the sensor, or other type of interface which allows a sensor of the non-contact voltage measurement system 102 to be positioned proximate the insulated wire 106.

Figure 2:
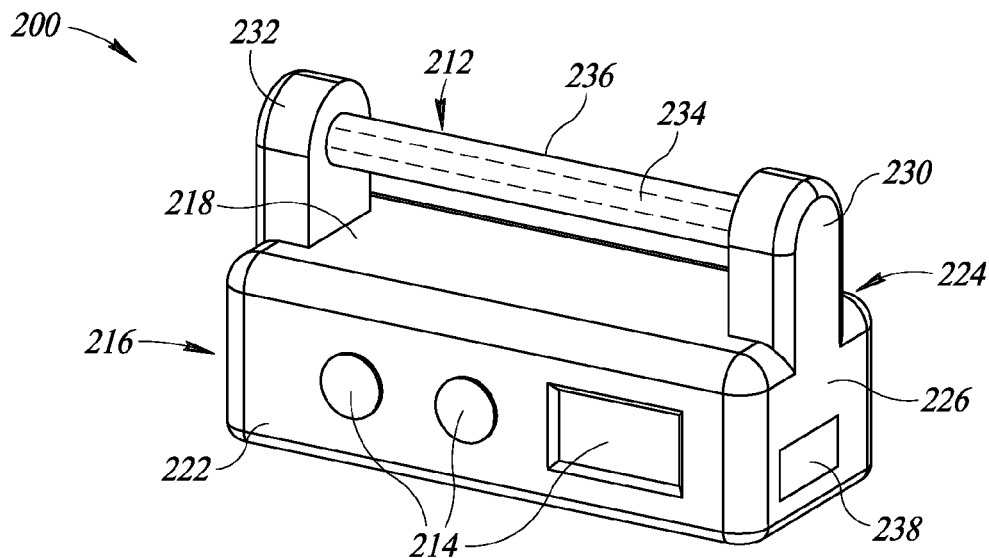
FIG. 2 is an isometric view of a non-contact voltage measurement system proving unit, according to one illustrated implementation.
Figure 3:
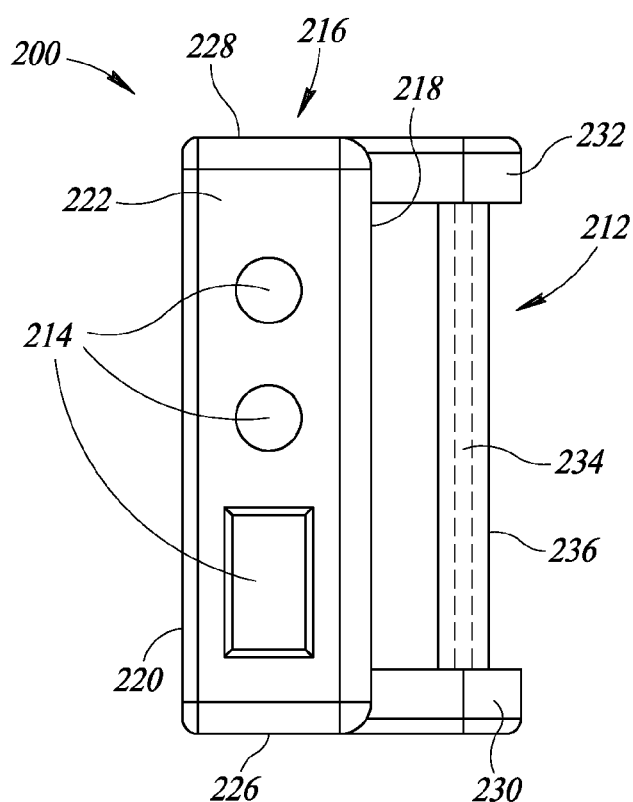
FIG. 3 is a front elevational view of the non-contact voltage measurement system proving unit of FIG. 2.
Figure 5:
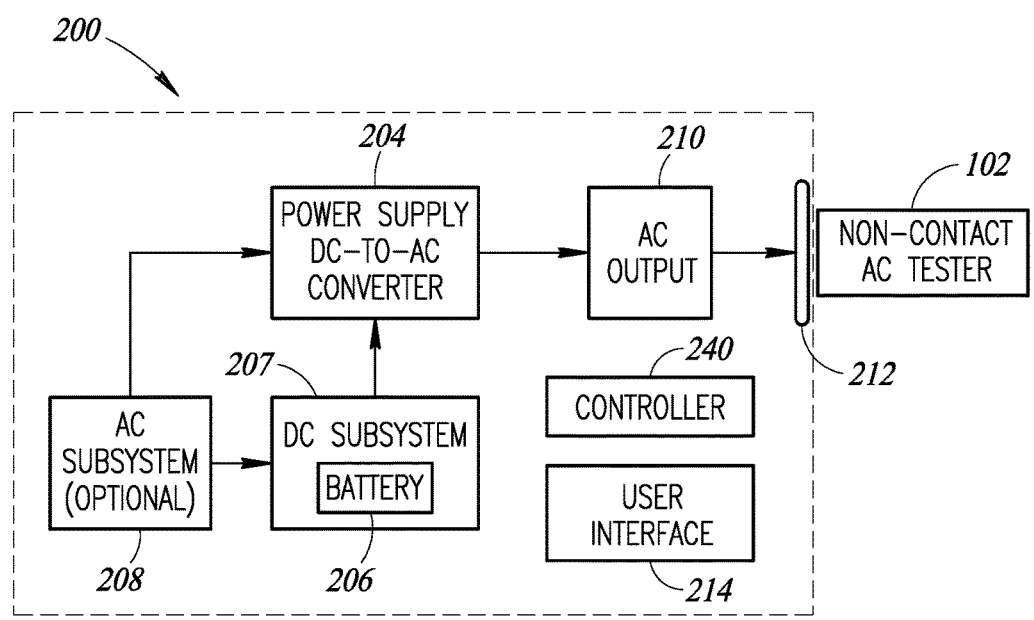
FIG. 5 is a schematic block diagram of a non-contact voltage measurement system proving unit, according to one illustrated implementation.

FIGS. 2 and 3 show an embodiment of a non-contact voltage proving unit or system 200 which may be used to verify or "prove" that a non-contact voltage measurement instrument or system, such as the non-contact voltage measurement system 102, is functioning properly. FIG. 5 shows a schematic block diagram of various components of the non-contact voltage proving unit 200.

In the illustrated implementation, the proving unit 200 includes a housing or body 216 which has a generally cuboid shape, having a top surface 218, a bottom surface 220 opposite the top surface, a front sidewall 222, a rear sidewall 224 opposite the front sidewall, a left lateral sidewall 226 and a right lateral sidewall 228 opposite the left lateral sidewall. In other implementations, the proving unit 200 may have a housing or body of a different shape.

Proximate the left lateral sidewall 226 there is a first wire support member 230 which extends outward from the top surface 218 of the housing 216. Proximate the right lateral sidewall 228 there is a second wire support member 232 which extends outward from the top surface 218 of the housing. The first and second wire support members 230 and 232 may be collectively referred to herein as a wire support portion. The first and second wire support members 230 and 232 support an insulated wire 212 which spans substantially the length of the housing 216 between the wire support members. At least a portion of a length of the insulated wire 212 is spaced outward apart from the top surface 218 of the housing 216, which allows for testing of non-contact voltage measurement systems that include a clamp or a hook, such that a clamp or hook can grasp the insulated wire during testing of the non-contact voltage measurement systems. The insulated wire 212 includes a conductor 234, shown in dashed lines, and an insulation layer 236 surrounding the conductor. The insulated wire 212 may be rigid or flexible. Further, the size and dimensions of the insulated wire 212 may be chosen to be similar to insulated wires that are intended to be measured by one or more non-contact voltage measurement systems, for example. Generally, the insulated wire 212 is accessible to a separate non-contact voltage measurement system capable of measuring voltage in the insulated wire without galvanically contacting the conductor 234 in the insulated wire.

The front sidewall 222 of the housing 216 may include a user interface 214 which includes one or more inputs (e.g., buttons, dials) that allows users to input control functions (e.g., select voltage level, select frequency) and/or one or more outputs (e.g., light (e.g., LED), display, speaker, buzzer) that provides indications (e.g., operational status) to the user. Although the user interface 214 is shown on the front sidewall 222 in the illustrated implementation, it is appreciated that the user interface 214 may be disposed on one or more of any of the outer surfaces of the housing 216. A suitable user interface may alternatively be provided on separate device that communicates via wired or wireless transmission with the proving unit 200.

As shown in FIG. 2, the housing 216 may also include a battery door 238 which provides access to a battery compartment inside the housing that selectively receives one or more batteries 206 therein. In other implementations, the housing 216 may include a battery compartment that permanently receives one or more batteries therein, such as one or more rechargeable batteries.

As shown in FIG. 5, the proving unit 200 includes a power supply 204 which may receive power from a DC power source subsystem 207 which may include or be selectively electrically coupled to one or more batteries 206. The proving unit 200 may also optionally include an AC power source subsystem 208 that receives AC power from an AC power source (e.g., AC mains). The one or more batteries 206 may be any suitable rechargeable or non-rechargeable batteries (e.g., alkaline, lithium ion, zinc-carbon, nickel-cadmium, nickel-metal hydride). In at least some implementations, the AC power source subsystem 208 may receive AC power and may generate DC power to recharge the one or more batteries 206 associated with the DC power source subsystem. In such instances, the AC power source subsystem 208 may include an AC-to-DC converter. The one or more batteries 206 may be removable from the housing 216 or, in implementations where rechargeable batteries are utilized, the one or more batteries may be fixed within the housing and charged from time-to-time by connecting the proving unit 200 to a suitable power source, such as an AC source coupled to the AC power source subsystem 208.

The power supply 204 may include a DC-to-AC converter, also referred to as an inverter, which converts DC voltage from the DC power source subsystem 207, or DC power generated by the AC power source subsystem, into AC voltage. The power supply 204 provides an AC voltage output 210 at a known or specified fixed AC voltage level or alternatively at various known or specified user selectable or device selectable AC voltage levels (e.g., 100 VAC, 200 VAC). The AC voltage output 210 may have a known or specified fixed frequency (e.g., 60 Hz) or alternatively may have various user selectable or device selectable frequencies (e.g., 50 Hz, 60 Hz). The AC voltage output 210 is fed through the conductor 234 of the insulated wire 212 and is of a sufficient amplitude (e.g., 100 VAC) that the voltage can be measured by non-contact voltage measurement systems.

The power supply 204 may include any suitable design for converting a DC voltage into an AC voltage. For example, the power supply 204 may include a switching boost converter which boosts the DC voltage from batteries 206 coupled to the DC power source subsystem 207 and then converts the boosted DC voltage to AC voltage. As another example, the power supply 204 may utilize one or more transformers to create the AC output voltage. In at least some implementations, the AC voltage output 210 may be a pure sine wave, a modified sine wave, etc.

The proving unit 200 may include a controller 240 (FIG. 5) that is operatively coupled to the user interface 214. The controller 240 may also be operatively coupled to the power supply 204 to control the operation of the power supply and/or to receive information (e.g., status information, configuration information) from the power supply 204. The controller 240 may include one or more processors, storage devices, buses, I/O interfaces, communications systems, etc., to control the functionality of the proving unit 200.

As an example, the controller 240 may include, or may be coupled to, voltage monitoring circuitry that monitors the output of the power supply 204. Thus, the controller 240 is operative to detect when the AC voltage output 210 is not at the specified voltage level. Upon such a determination, the controller 240 may cause an output (e.g., light, display, speaker) of the user interface 214 to provide a visual, audible and/or haptic indicator to the user that the proving unit 200 is not functioning properly and should not be used to verify the operation of a non-contact voltage measurement system.

In implementations wherein the power supply 204 can output a plurality of user- or device-selectable output voltages and/or frequencies, the controller 240 may be able to selectively instruct the power supply (e.g., the DC-to-AC converter) to output a specified voltage level and/or a specified frequency level. The power supply 204 may utilize any suitable technique to provide multiple different voltage levels and/or frequencies. As an example, the power supply 204 may include various components that are switched in or out of a circuit dependent on the specified voltage level and/or frequency to be output by the power supply 204. As another example, one or more operational parameters (e.g., switching frequency, switch duty cycle) may be selectively adjusted dependent on the specified voltage level and/or frequency to be output by the power supply 204.

As used herein, the term processor is not limited to integrated circuits referred to in the art as a computer, but broadly refers to a microcontroller, a microcomputer, a microprocessor, a programmable logic controller, an application specific integrated circuit, other programmable circuits, combinations of the above, among others. The controller 240 may serve as the computational center of the proving unit 200 by supporting the execution of instructions and reading and writing data to one or more storage devices, I/O interfaces, and communication systems. The storage devices associated with the controller 240 may include one or more forms of nontransitory processor-readable storage media. Nontransitory processor-readable storage media is any currently available or later developed media suitable for storing programs and data accessible by one or more device components, such as a processor of the controller. Nontransitory processor readable storage media may be removable or non-removable and may be volatile or non-volatile. Examples of nontransitory processor-readable storage media may include hard drives as well as RAM, ROM, EEPROM, flash types of memory, etc.

The user interface 214 may include a display, for example, a liquid crystalline display (LCD) device, a light emitting diode (LED) device, and/or an organic light emitting diode (OLED) device. The user interface 214 may include touch screen, which may be any type of touch screen currently known or later developed. For example, the touch screen may be a capacitive, infrared, resistive, or surface acoustic wave (SAW) device.

The user interface 214 may include a single input device or a combination of input devices which communicate an input to the proving unit 200. The input device(s) may include, for example, buttons, switches, trigger switches, selectors, a rotary switch or other input devices known to those of ordinary skill in the art. The input device(s) may be used to toggle the operational status (e.g., OFF/ON) of the proving unit 200, and/or may be used to select one or more AC voltage output levels (e.g., 100 VAC, 120 VAC, 200 VAC, 240 VAC) and/or one or more AC frequency levels (e.g., 50 Hz, 60 Hz).

In operation, the technician may first turn the proving unit 200 ON via an input (e.g., button, switch) of the user interface 214. In implementations where the proving unit 200 is operative to supply multiple AC voltage levels and/or multiple AC frequencies, the technician may also select via the user interface 214 an AC voltage level and/or an AC frequency to be output by the proving unit.

Once the proving unit 200 is powered ON, the power supply 204 energizes the conductor 234 in the insulated wire 212 to the AC output voltage 210. An output of the user interface 214, such a light (e.g., LED) or display, may provide the user with a visual and/or audible indication that the proving unit 200 is in fact outputting the specified AC output voltage, which lets the user know that the proving unit is operational and ready for use.

Figure 4:
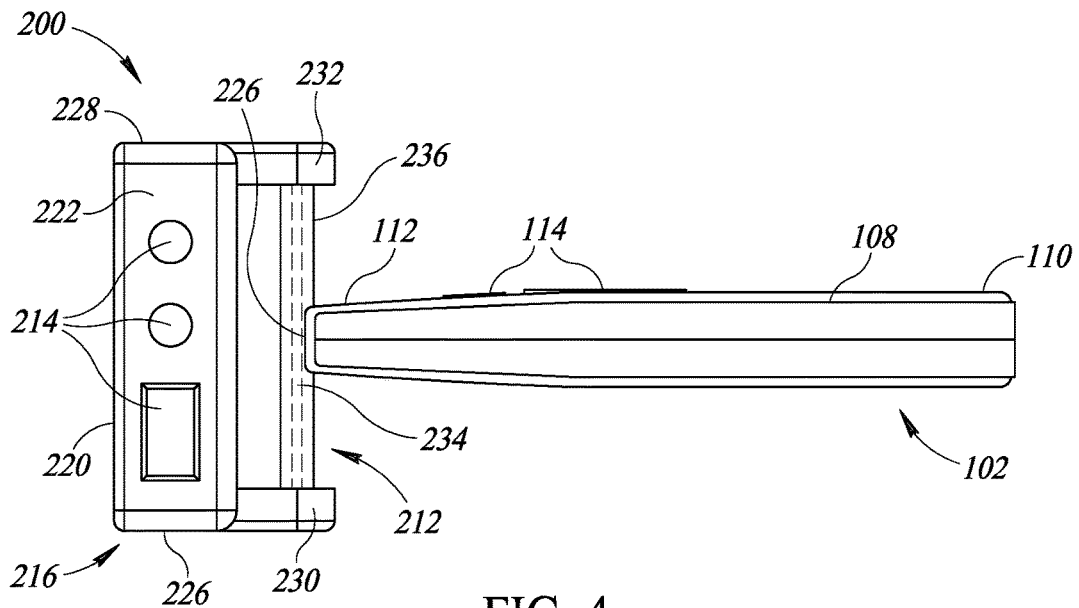
FIG. 4 is a front elevational view of the non-contact voltage measurement system proving unit of FIG. 2, shown with a front end of a non-contact voltage measurement system contacting an insulated wire of the proving unit to verify the operation of the non-contact voltage measurement system.

As shown in FIG. 4, the user may then position the probe end 112 of the non-contact voltage measurement system 102 in contact with the insulated wire 212 to verify or prove the operation of the non-contact voltage measurement system. The non-contact voltage measurement system 102 should measure and display the same AC voltage level that is output by the proving unit 200 in the insulated wire 212 if the non-contact voltage measurement system is working properly. Once the non-contact voltage measurement system 102 has been verified by the proving unit 200, the non-contact voltage measurement system may then be used normally in the field to obtain the desired measurements.

Figure 6:
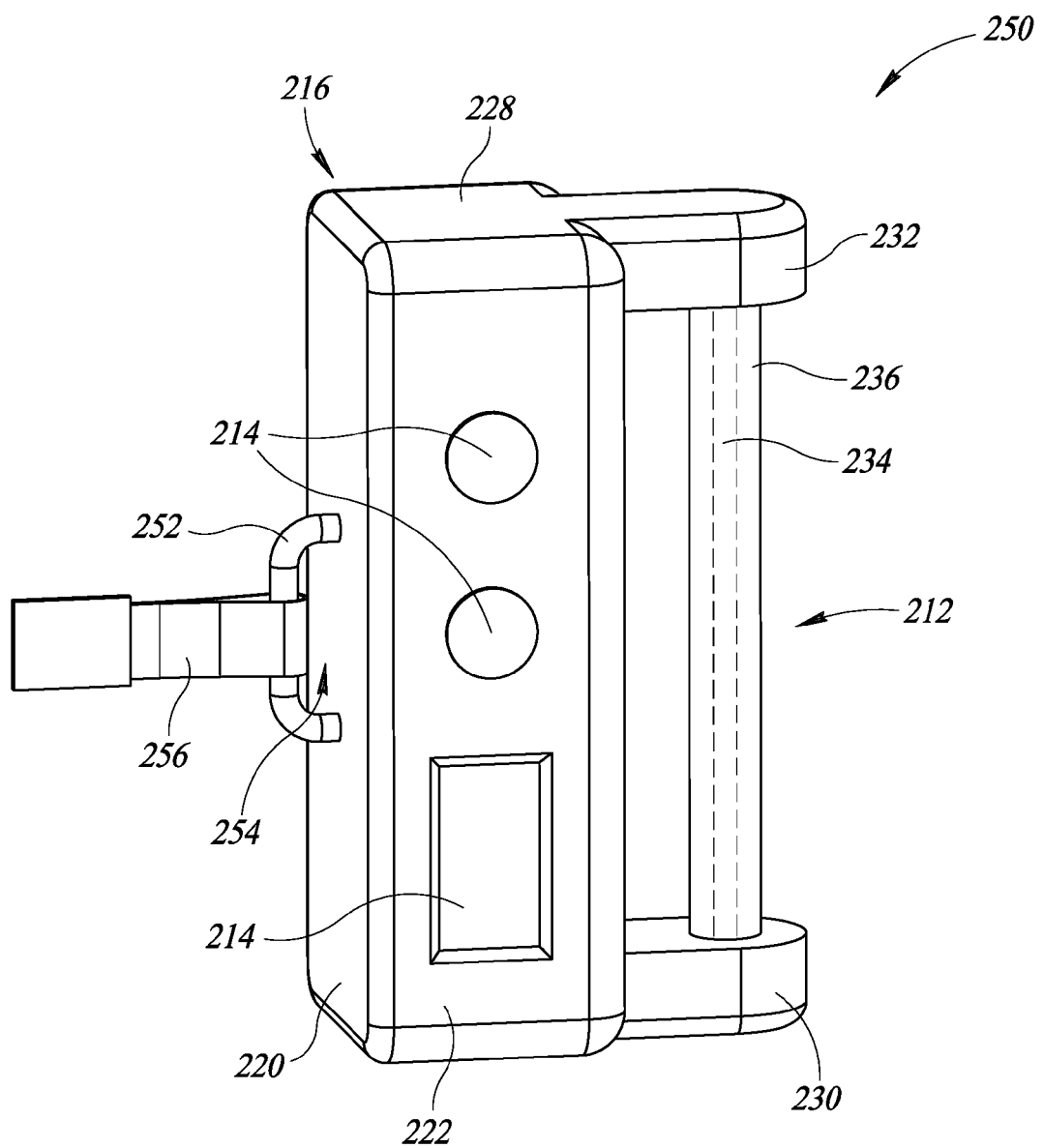
FIG. 6 is a pictorial diagram of a non-contact voltage measurement system proving unit that includes a strap mount for selectively coupling a strap to the non-contact voltage measurement system proving unit, according to one illustrated implementation.

FIG. 6 shows another implementation of a non-contact voltage measurement system proving unit 250. The non-contact voltage measurement system proving unit 250 may be similar or identical to the non-contact voltage measurement system proving unit 200 in many respects. Accordingly, a detailed discussion of the proving unit 250 is omitted for the sake of brevity. In this implementation, the non-contact voltage measurement system proving unit 250 includes an attachment point or strap mount 252 extending outward from the bottom surface 220 of the housing 216 of the proving unit 250. The strap mount 252 may form a closed loop 254 with the bottom surface 220, which loop 254 may removably receive a strap 256 therethrough. The strap 256 may be attached to a fixture (e.g., equipment, rack) such that the proving unit 250 hangs from the fixture, which allows the user to utilize the proving unit without having to hold the proving unit, thus freeing the user's hands.

Although the strap mount 252 is shown on the bottom surface 220 of the housing 216 in FIG. 6, it should be appreciated that in other implementations a strap mount may be positioned on one or more other surfaces (e.g., left lateral sidewall 226, right lateral sidewall 228, rear sidewall 224) of the housing. Further, the strap mount 252 may be shaped, sized and dimensioned in any suitable manner which allows a strap 256 to be secured to the housing 216. Additionally, in at least some implementations the strap mount 252 may be selectively removable from the housing 216. For example, the strap mount 252 may include a threaded member, and the housing 216 may include a threaded aperture therein which selectively receives the threaded member to secure the strap mount 252 to the housing 216.

The foregoing detailed description has set forth various implementations of the devices and/or processes via the use of block diagrams, schematics, and examples. Insofar as such block diagrams, schematics, and examples contain one or more functions and/or operations, it will be understood by those skilled in the art that each function and/or operation within such block diagrams, flowcharts, or examples can be implemented, individually and/or collectively, by a wide range of hardware, software, firmware, or virtually any combination thereof. In one implementation, the present subject matter may be implemented via Application Specific Integrated Circuits (ASICs). However, those skilled in the art will recognize that the implementations disclosed herein, in whole or in part, can be equivalently implemented in standard integrated circuits, as one or more computer programs running on one or more computers (e.g., as one or more programs running on one or more computer systems), as one or more programs running on one or more controllers (e.g., microcontrollers) as one or more programs running on one or more processors (e.g., microprocessors), as firmware, or as virtually any combination thereof, and that designing the circuitry and/or writing the code for the software and or firmware would be well within the skill of one of ordinary skill in the art in light of this disclosure.

Those of skill in the art will recognize that many of the methods or algorithms set out herein may employ additional acts, may omit some acts, and/or may execute acts in a different order than specified. As an example, in at least some implementations a non-contact voltage measurement system proving unit may not utilize a processor to execute instructions. For example, a non-contact voltage measurement system proving unit may be hardwired to provide some or all of the functionality discussed herein. Additionally, in at least some implementations a non-contact voltage measurement system proving unit may not utilize a processor to cause or initiate the different functionality discussed herein. For example, such non-contact voltage measurement system proving unit may rely on one or more separate inputs, such as a user-actuated button which causes the proving unit to output an AC voltage on the insulated wire 212.

In addition, those skilled in the art will appreciate that the mechanisms taught herein are capable of being distributed as a program product in a variety of forms, and that an illustrative implementation applies equally regardless of the particular type of signal bearing media used to actually carry out the distribution. Examples of signal bearing media include, but are not limited to, the following: recordable type media such as floppy disks, hard disk drives, CD ROMs, digital tape, and computer memory.

The various implementations described above can be combined to provide further implementations. To the extent that it is not inconsistent with the specific teachings and definitions herein, U.S. Provisional Patent Application No. 62/421,124, filed Nov. 11, 2016, is incorporated herein by reference, in its entirety.

These and other changes can be made to the implementations in light of the above-detailed description. In general, in the following claims, the terms used should not be construed to limit the claims to the specific implementations disclosed in the specification and the claims, but should be construed to include all possible implementations along with the full scope of equivalents to which such claims are entitled. Accordingly, the claims are not limited by the disclosure.

The invention claimed is:

1. A proving unit to verify the operation of a non-contact alternating current (AC) voltage measurement system, the proving unit comprising:
 a direct current (DC) power source subsystem, the DC power source subsystem comprising an output that provides a DC voltage;
 a DC-to-AC converter comprising an input and an output, the input of the DC-to AC converter electrically coupled to the output of the DC power source subsystem, wherein in operation the DC-to-AC converter receives the DC voltage from the DC power source subsystem and converts the DC voltage to a specified AC voltage at the output of the DC-to-AC converter;
 an insulated wire comprising a conductor surrounded by an insulation layer, the conductor electrically coupled to the output of the DC-to-AC converter; and a wire support portion coupled to the insulated wire which physically supports the insulated wire such that the insulated wire is accessible to a separate non-contact AC voltage measurement system capable of measuring voltage in the insulated wire without galvanically contacting the conductor in the insulated wire.

2. The proving unit of claim 1, further comprising a housing containing the DC power source subsystem and the DC-to-AC converter, wherein the wire support portion supports the insulated wire such that at least a portion of a length of the insulated wire is spaced outward apart from an external surface of the housing.

3. The proving unit of claim 2 wherein the wire support portion comprises a first wire support member extending outward from the housing and a second wire support member extending outward from the housing, the second wire support member spaced apart from the first wire support member, the first wire support member supporting a first end of the insulated wire and the second wire support member supporting a second end of the insulated wire opposite the first end such that insulated wire spans between the first wire support member and the second wire support member.

4. The proving unit of claim 1 wherein the DC power source subsystem comprises at least one battery.

5. The proving unit of claim 1 wherein the housing comprises at comprises a battery compartment sized and dimensioned to receive at least one battery therein, and the DC power source subsystem comprises an input that is electrically coupleable to the at least one battery positioned in the battery compartment.

6. The proving unit of claim 1 wherein the DC-to-AC converter comprises at least one of a switching boost converter or a transformer.

7. The proving unit of claim 1, further comprising an indicator that in operation provides an indication of whether a specified AC voltage is present in the insulated wire, the indicator comprising at least one of an audible indicator or a visual indicator.

8. The proving unit of claim 1, further comprising:
a user interface; and
at least one processor communicatively coupled to the user interface and the DC-to-AC converter, wherein, in operation, the at least one processor:
receives, via the user interface, a selection of an AC voltage level from a plurality of AC voltage levels; and
causes the DC-to-AC converter to output the AC voltage at the selected AC voltage level based at least in part on the received selection.

9. The proving unit of claim 1, further comprising a strap mount coupled to an external surface of a housing containing the DC power source subsystem and the DC-to-AC converter, the strap mount operative to selectively couple with a strap.

10. The proving unit of claim 1, further comprising an AC power source subsystem, wherein in operation the AC power source subsystem receives AC power from an AC power source, and directly or indirectly provides power to the DC-to-AC converter.

11. The proving unit of claim 10 wherein the AC power source subsystem provides power to at least one battery electrically coupled to the DC power source sub system.

12. A method to verify the operation of a non-contact alternating current (AC) voltage measurement system, the method comprising:

providing, via an output of a direct current (DC) power source subsystem, DC power received from a DC power source;
receiving, at an input of a DC-to-AC converter, the DC power output from the DC power source subsystem;
converting, via the DC-to-AC converter, the received DC voltage to a specified AC voltage at an output of the DC-to-AC converter; and
energizing an insulated wire with the specified AC voltage output by the DC-to-AC converter, wherein the insulated wire comprises a conductor surrounded by an insulation layer and is accessible to a separate non-contact AC voltage measurement system capable of measuring voltage in the insulated wire without galvanically contacting the conductor in the insulated wire.

13. The method of claim 12, further comprising supporting the insulated wire such that at least a length of the insulated wire is spaced apart from any an external surface of a housing containing the DC power source subsystem and the DC-to-AC converter.

14. The method of claim 13 wherein supporting the insulated wire comprises supporting the insulated wire via a first wire support member and a second wire support member, the second wire support member spaced apart from the first wire support member, the first wire support member supporting a first end of the insulated wire and the second wire support member supporting a second end of the insulated wire opposite the first end such that insulated wire spans between the first wire support member and the second wire support member.

15. The method of claim 12 wherein providing DC power comprises providing DC power received from at least one battery.

16. The method of claim 12, further comprising providing, via an indicator, an indication of whether a specified AC voltage is present in the insulated wire.

17. The method of claim 12, further comprising:
receiving, via a user interface, a selection of an AC voltage level from a plurality of AC voltage levels; and
causing the DC-to-AC converter to output the AC voltage at the selected AC voltage level based at least in part on the received selection.

18. The method of claim 17, further comprising:
receiving, via an AC power source subsystem, AC power from an AC power source; and
providing, directly or indirectly, power to the DC-to-AC converter via the AC power source subsystem.

19. The method of claim 18 wherein providing power to the DC-to-AC converter comprises providing power to at least one battery electrically coupled to the DC power source subsystem.

20. A proving unit to verify the operation of a non-contact alternating current (AC) voltage measurement system, the proving unit comprising:
a housing;
a direct current (DC) power source subsystem disposed within the housing, the DC power source subsystem comprising an input that receives power from at least one battery and an output that provides a DC voltage;
a DC-to-AC converter disposed in the housing, the DC-to-AC converter comprising an input and an output, the input of the DC-to-AC converter electrically coupled to the output of the DC power source subsystem, wherein in operation the DC-to-AC converter receives the DC voltage from the DC power source subsystem and converts the DC voltage to a specified AC voltage at the output of the DC-to-AC converter;

an insulated wire comprising a conductor surrounded by an insulation layer, the conductor electrically coupled to the output of the DC-to-AC converter; and a wire support portion coupled to the insulated wire which physically supports the insulated wire such that at least a portion of a length of the insulated wire is spaced outward apart from an external surface of the housing.

\* \* \* \* \*